United States Patent [19]
Le et al.

[11] Patent Number: 5,652,444
[45] Date of Patent: Jul. 29, 1997

[54] STRUCTURE AND METHOD FOR MAKING FETS AND HEMTS INSENSITIVE TO HYDROGEN GAS

[75] Inventors: Minh V. Le, Simi Valley; Jeff B. Shealy; Loi D. Nguyen, both of Thousand Oaks, all of Calif.

[73] Assignee: Hughes Electronics, Los Angeles, Calif.

[21] Appl. No.: 532,917

[22] Filed: Sep. 22, 1995

[51] Int. Cl.[6] .................................................. H01L 29/47
[52] U.S. Cl. ...................... 257/280; 257/473; 257/744; 257/761; 257/763; 437/184; 437/185; 437/190; 437/192
[58] Field of Search ......................... 257/280, 472, 257/473, 744, 745, 751, 761, 763, 764; 437/184, 185, 189, 190, 192

[56] References Cited

U.S. PATENT DOCUMENTS 5,049,954  9/1991  Shimada et al. ............................ 257/280

FOREIGN PATENT DOCUMENTS 0184047  6/1986  European Pat. Off. ............... 257/761
0217360  12/1984  Japan .................................... 257/761

OTHER PUBLICATIONS

"Hydrogen Effects On Reliability of GaAs MMICs", *GaAs IC Symposium*, William O. Camp, Jr., Randall Lasater, Vincent Genova, Robert Hume, pp. 203–206, 1989, IEEE.
"HEMT Degradation in Hydrogen Gas", P.C. Chao, M.Y. Kao, K. Nordheden, A.W. Swanson, *IEEE Electron Device Letters*, vol. 15, No. 5, May 1994.
Abstract for Japan Kokai Publication #59–132660 to Nagai, Abs. Pub. Nov. 1984, 1 Sheet.

*Primary Examiner*—Peter Toby Brown
*Attorney, Agent, or Firm*—Vijayalakshmi Duraiswamy; Wanda K. Denson-Low

[57] ABSTRACT

A structure and method for making HEMTs with a gate metal having a layer comprising titanium, a layer comprising vanadium over the layer comprising titanium, and a layer comprising gold over the layer comprising vanadium. Such HEMTs are insensitive to hydrogen.

6 Claims, 3 Drawing Sheets

TI/V/AU GATE HEMTS
UNDER 4% HYDROGEN
GM, MAX Vs. TIME

TI/V/Au GATE HEMTS
UNDER 4% HYDROGEN
Idss Vs. TIME

TI/V/AU GATE HEMTS UNDER 4% HYDROGEN GATE LEAKAGE Vs TIME

TI/V/AU GATE HEMTS UNDER 4% HYDROGEN VPO Vs. TIME

STRUCTURE AND METHOD FOR MAKING FETS AND HEMTS INSENSITIVE TO HYDROGEN GAS

BACKGROUND OF THE INVENTION

1. Field of the Invention

The present invention relates in general to a field-effect transistor epitaxial structure. More particularly, the present invention relates to a novel gate metal used for Field Effect Transistors (FETs) and High Electron Mobility Transistors (HEMTs).

2. Description of the Related Art

Today, FETs and HEMTs fabricated for microwave and millimeter wave applications commonly use a three-layer combination of titanium (Ti)/platinum (Pt)/gold (Au) as a gate metal because of the outstanding electrical and thermal stability of the combination. The effects of hydrogen on FETs or HEMTs with Ti/Pt/Au gates, however, has become a concern when using these devices in a hydrogen environment such as in hermetically sealed packaging.

Though the combination of a Ti/Pt/Au gate metal allows for a reliable, low resistance contact to the device, researchers have recognized Pt as responsible for the failure of hermetically sealed devices, see W. O. Camp, Jr., et al., "Hydrogen Effects On Reliability of GaAs MMICs," Proc. GaAs IC Symp., pg. 203, 1989. In a hydrogen environment, a catalytic reaction of hydrogen ($H_2$) with Pt results in the formation of atomic hydrogen (H), resulting in the decreased performance of the device.

Researchers have also recognized the degradation of InP HEMT performance in a hydrogen environment, see P. C. Chao et al., "HEMT Degradation in Hydrogen Gas," IEEE Device Letters, Vol. 15, No. 5 (May 1994). In InP HEMTs with Ti/Pt/Au gates, the hydrogen reaction creates a shift of the gate built-in potential, resulting in a threshold voltage shift toward more positive or more negative depending on the construction of the device. The shift in threshold voltage increases or decreases the device drain current at a fixed gate bias and effects the performance of the device. Potential candidates for a hydrogen gate metal, such as tungsten, are not suitable because they require deposition techniques which are more complex and costly.

Therefore, there is a need for a gate metal structure which is insensitive to hydrogen's effects on FET and HEMT performance, economical, and compatible with existing structures and manufacturing techniques. The new gate metal must also be free from electromigration effects, reliable under operating conditions, and a good electrical conductor.

SUMMARY OF THE INVENTION

The present invention provides a novel layered metal structure for semiconductor, the metal structure comprising a layer of vanadium (V). Preferably, the metal structure of the present invention is used as a gate metal, however, the metal structure of the present invention is suitable for use as a metal contact to other device terminals. The preferred gate metal structure comprises three layers: a first layer over the semiconductor comprising Ti, a second layer over the Ti layer comprising V, and a third layer over the V layer comprising Au. Because the new Ti/V/Au metal combination is insensitive to hydrogen, the performance characteristics of the device are not affected by a hydrogen atmosphere.

The preferred Ti/V/Au metal combination is also reliable when subject to the temperature and operating conditions the gate metal must endure. The new metal has a limited reactivity with the substrate and other materials, is relatively free of electromigration effects, and maintains good electrical conductivity. Moreover, the Ti/V/Au gate metal is compatible with existing device fabrication techniques, such as electron-beam (E-beam) deposition, and thus avoids increasing the complexity of manufacturing the device.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
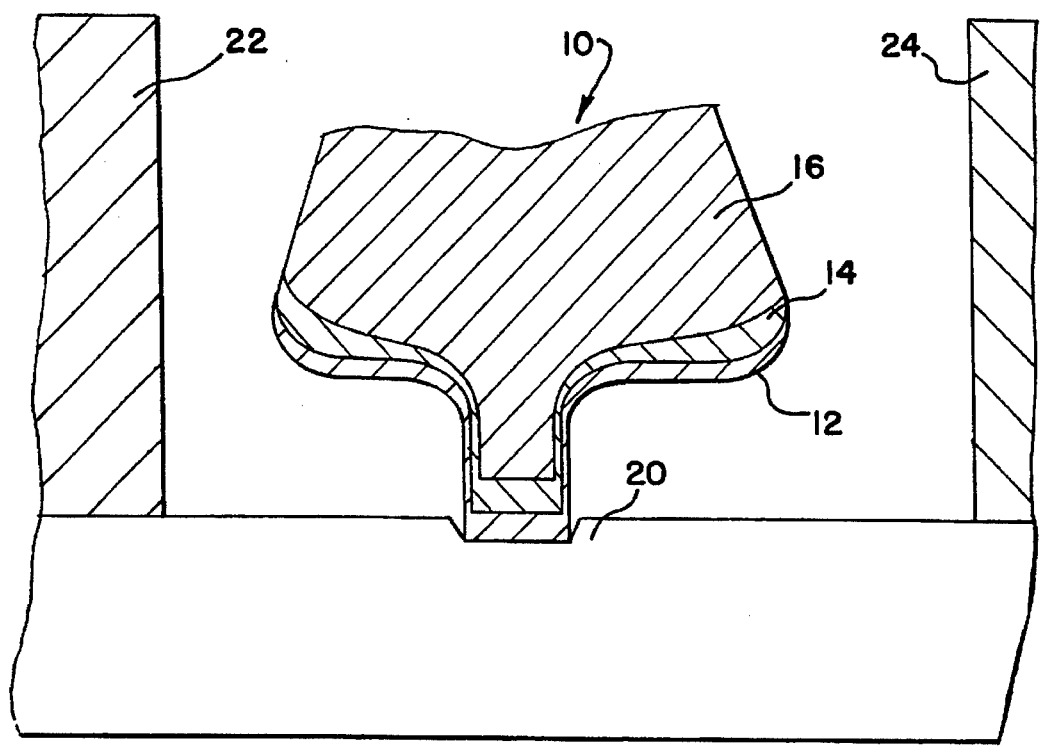
FIG. 1 is a cross-sectional drawing of a transistor with the gate metal combination of the present invention.

FIG. 1 shows the gate metal combination 10 of the preferred embodiment of the present invention. The gate metal is in contact with the semiconductor active layer or substrate 20 and is preferably situated between the source 22 and drain 24 of the device. As shown in FIG. 1, the preferred embodiment replaces the Pt layer in a conventional gate metal by a V layer 14. The gate metal structure 10 comprises at least two metallic layers. A first layer 12, over the semiconductor active layer 20, is comprised of Ti 12. A second layer 14 over the Ti layer 12 is comprised of V. Most preferably, a third layer 16, comprised of Au, is over the V layer 14.

Preferably, the gate metal is fabricated onto the substrate by a conventional E-beam evaporative deposition technique. Other deposition techniques well known to those skilled in the art, for example sputtering, could also be used. First, a layer comprising Ti metal 12 is deposited over the semiconductor active layer 20. Second, a layer comprising V 14 is deposited over the Ti layer 12. Third, a layer comprising Au 16 is deposited over the V layer 14. Preferably, the metal alloys used in the combination contain about 90% to 95% of the desired metal. The use of alloys containing lesser amounts of Ti, V, or Au is less preferred. Most preferably, the deposited metal, Ti, V or Au, is essentially free of other materials.

The individual layers of metal may be deposited to thicknesses according to thermal and design considerations well known in the art for fabricating conventional Ti/Pt/Au gate metals. Preferably, depending on the particular application and desired device characteristics, the Ti layer thickness may range from between about 100 to about 1500 angstroms, the V layer from about 100 to about 2500 angstroms, and the Au layer from about 500 to about 3500 angstroms. More preferred is a Ti layer having a thickness between about 250 to about 750 angstroms, a V layer having a thickness between about 250 to about 750 angstroms and an Au layer having a thickness between about 1000 to about 3500 angstroms. In the most preferred embodiment, the Ti and V layers are each deposited to a thickness of about 500 angstroms, and the Au layer is about 3500 angstroms in thickness.

EXAMPLE

To verify the insensitivity of the Ti/V/Au gate metal to hydrogen, 20 InP HEMT transistors were fabricated in accordance with the preferred embodiment were subjected to a hydrogen-containing atmosphere. 10 devices were stressed unbiased at 170° C. in a nitrogen atmosphere containing 4% hydrogen and 10 devices were stressed unbiased at 170° C. in a pure nitrogen atmosphere as a control group. In order to monitor the changes in device characteristics, the DC parameters of the device were measured before the test, and periodically during the test at room temperature. The measured DC parameters were drain current, transconductance, pinch-off voltage, and gate leakage current.

Figure 6:
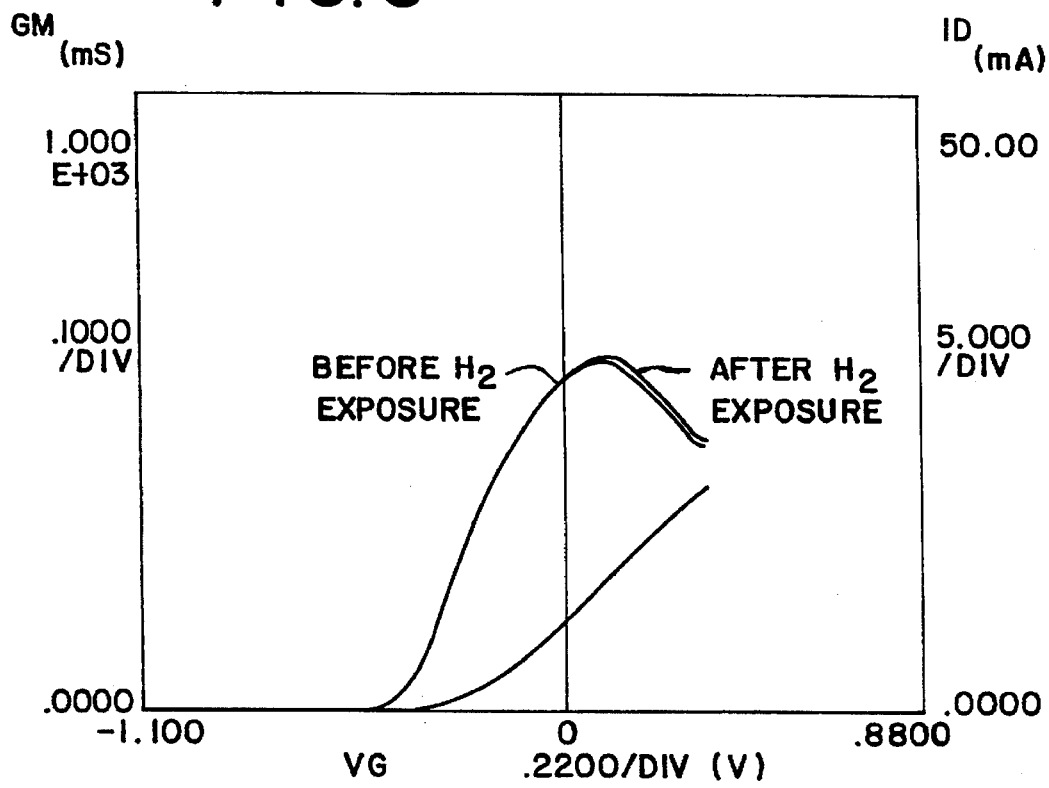
FIG. 6 shows the DC characteristics of a device with the gate construction shown in FIG. 1 when exposed to a 4% hydrogen gas over a 240 hour period.
Figure 2:
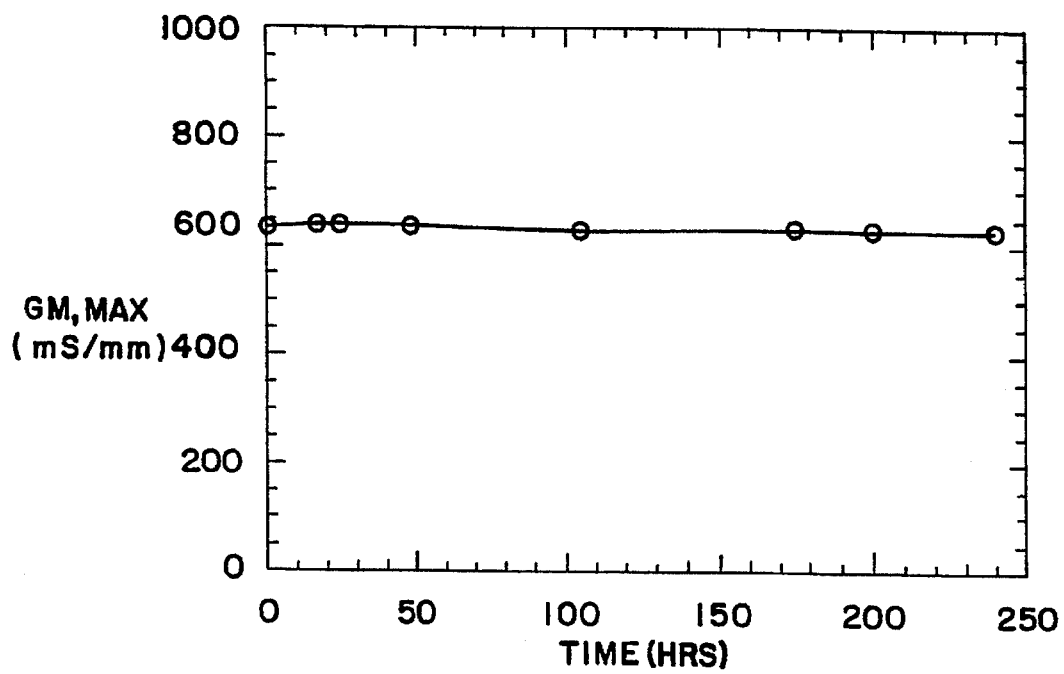
FIG. 2 shows the transconductance (gm) of a device with the gate construction shown in FIG. 1 when exposed to 4% hydrogen gas over a 240 hour period.
Figure 3:
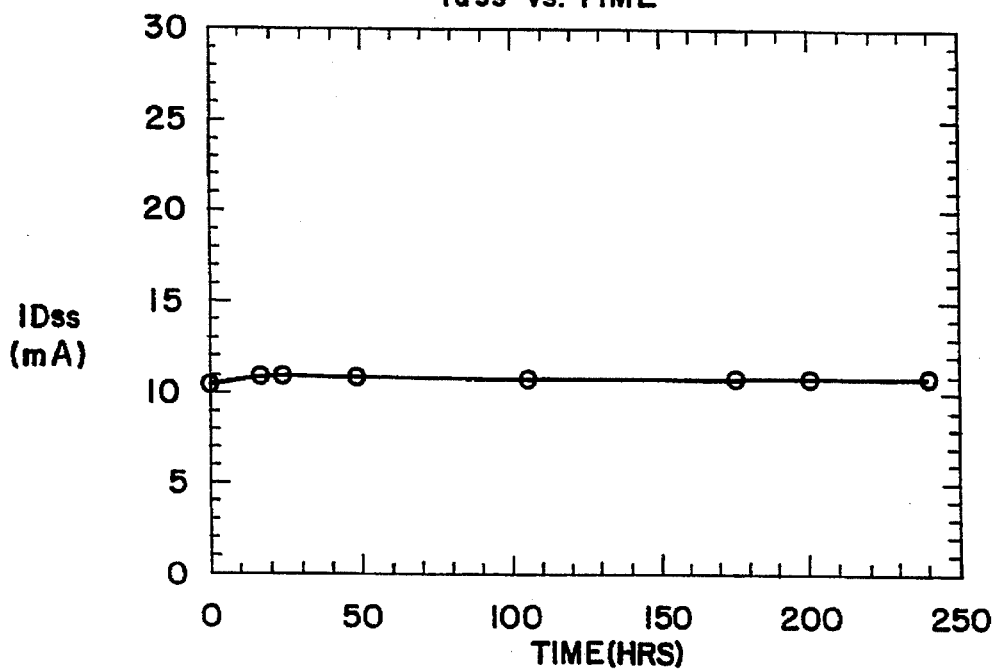
FIG. 3 shows the drain current (Idss) of a device with the gate construction shown in FIG. 1 when exposed to 4% hydrogen gas over a 240 hour period.
Figure 4:
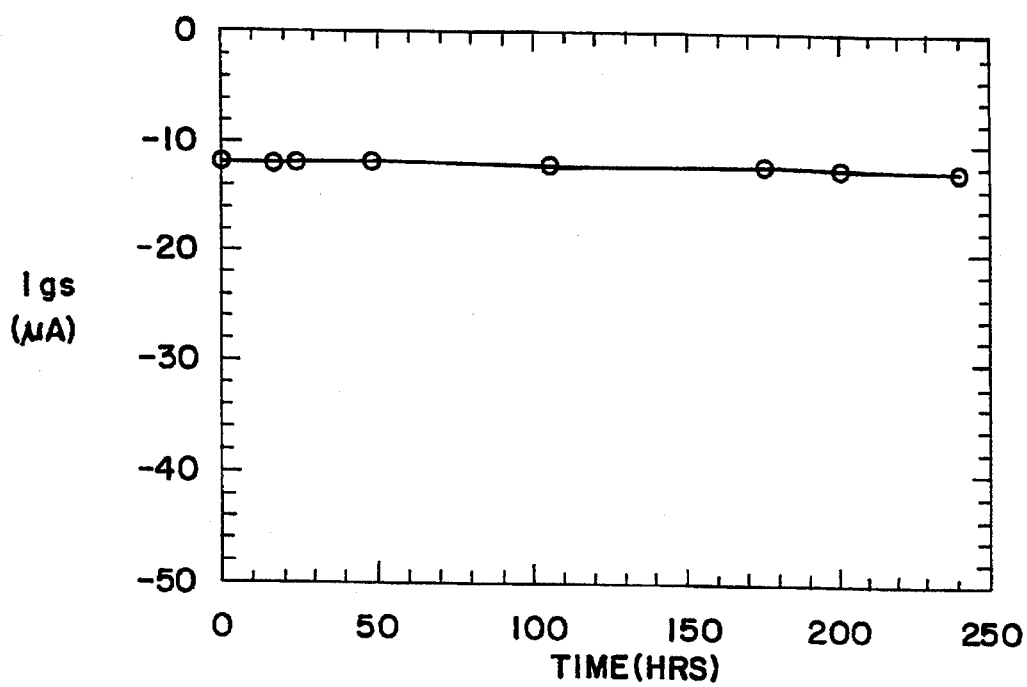
FIG. 4 shows the gate leakage current (Igs) of a device with the gate construction shown in FIG. 1 when exposed to a 4% hydrogen gas over a 240 hour period.
Figure 5:
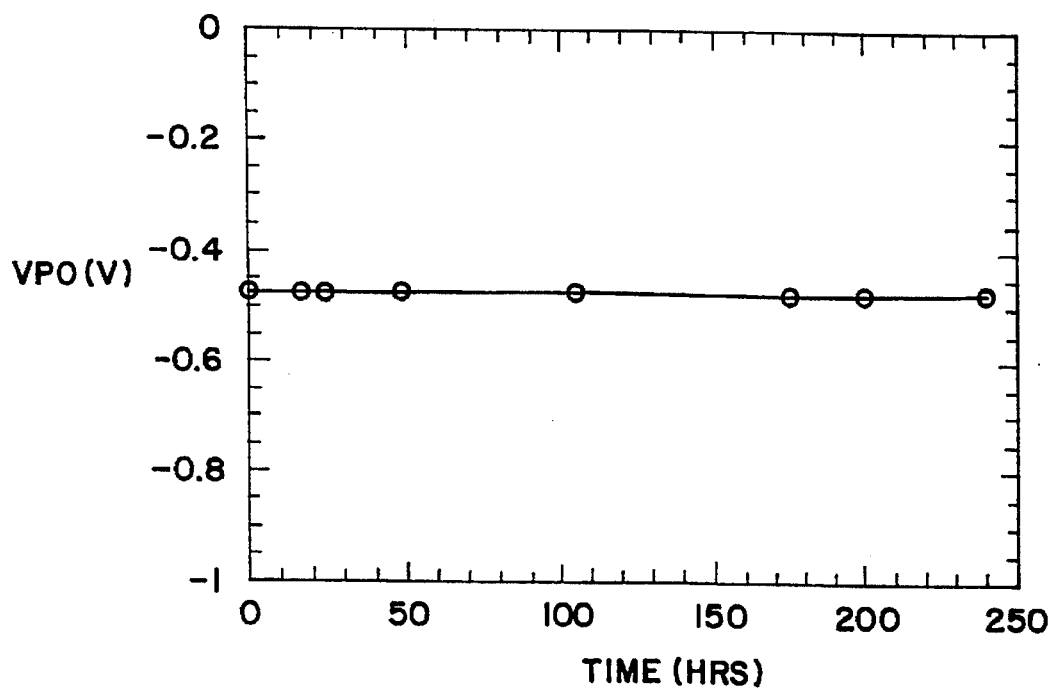
FIG. 5 shows the pinch-off voltage (Vpo) of a device with the gate construction shown in FIG. 1 when exposed to a 4% hydrogen gas over a 240 hour period.

After 240 hours under the hydrogen environment, the DC characteristics of HEMTs with the Ti/V/Au gates were substantially unaffected. The measured test results of the InP HEMTs with the gate metal structure of the present invention are shown in FIGS. 2 to 5. FIG. 2 shows the stability of the transconductance (gm) of a device with the gate construction shown in FIG. 1 when exposed to 4% hydrogen gas over a 240 hour period. FIG. 3 shows the stability of the drain current (Idss) of the device over the same period. FIG. 4 shows the stability of the gate leakage current (Igs) over the 240 hour period. FIG. 5 shows the stability of the pinch-off voltage (Vpo) over the 240 hour period. FIG. 6 shows the DC characteristics of a device with the gate construction shown in FIG. 1 when exposed to a 4% hydrogen gas over a 240 hour period.

As these test results demonstrate, the characteristics of these devices with a Ti/V/Au gate were unaffected by the hydrogen atmosphere. In comparison, unpassivated FETs or HEMTs with Ti/Pt/Au gates, the DC characteristics are typically affected within just a few hours of contact with hydrogen. Given the compatibility of vanadium with the transistor environment and its limited reactivity with hydrogen, the platium layer of a gate metal which must be exposed to hydrogen can be replaced with a layer of vanadium.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

We claim:

1. A field effect transistor having a substrate, a drain formed on the substrate, a source formed on the substrate, a gate metal formed on the substrate adjacent the source and the drain, the gate metal comprising:

a first layer comprising Ti; and a second layer comprising V over the layer of Ti, wherein the second layer comprising V has a thickness of about 500 angstroms.

2. The field effect transistor of claim 1 where:

the layer comprising Ti has a thickness between about 100 angstroms and about 1500 angstroms; and further comprising a third layer comprising Au and having a thickness between about 500 and about 3500 angstroms.

3. The field effect transistor of claim 1 where:

the layer comprising Ti has a thickness of about 500 angstroms; and further comprising a third layer comprising Au and having a thickness of about 3500 angstroms.

4. A method of fabricating a gate contact metal for a semiconductor device, comprising the steps of:

depositing a layer comprising Ti over the semiconductor; and depositing a layer comprising V having a thickness of about 500 angstroms over the layer of Ti.

5. The method of claim 4 further comprising the step of:

depositing a layer comprising Au over the layer of V.

6. The method of claim 4 where the depositing is accomplished by electron beam deposition.

* * * * *